US010712806B1

(12) United States Patent
Park et al.

(10) Patent No.: US 10,712,806 B1
(45) Date of Patent: Jul. 14, 2020

(54) MANAGEMENT OF POWER STATE TRANSITIONS OF A MEMORY SUB-SYSTEM

(71) Applicant: Micron Technology, Inc., Boise, ID (US)

(72) Inventors: Kihoon Park, Cupertino, CA (US); David A. Holmstrom, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/230,299

(22) Filed: Dec. 21, 2018

(51) Int. Cl.
*G06F 1/3234* (2019.01)
*G06F 1/28* (2006.01)
*G06F 1/3296* (2019.01)

(52) U.S. Cl.
CPC .............. *G06F 1/3275* (2013.01); *G06F 1/28* (2013.01); *G06F 1/3296* (2013.01)

(58) Field of Classification Search
CPC ........ G06F 1/3275; G06F 1/3243; G06F 1/28; G06F 1/3296
See application file for complete search history.

(56) References Cited

U.S. PATENT DOCUMENTS

| 8,819,461 B2 | 8/2014 | Sodhi et al. | |
| 2014/0181555 A1* | 6/2014 | Bodas | G06F 9/4812 713/323 |
| 2019/0286219 A1* | 9/2019 | Anazawa | G06F 1/28 |

OTHER PUBLICATIONS

"Designing Energy Efficient SATA Devices", Overview and Implementation Recommendations, 2011-2013 Platforms, 26 pages.
"System Sleep Criteria", May 30, 2018, 2 pages.
Intel Corporation; Sandisk Corporation Serial ATA Device Sleep (DevSleep) and Runtime D3 (RTD3), Dec. 2011, 11 pages.
"System Power States", May 30, 2018, 9 pages.
Micheletti Testing SATA DevSleep for Today's Power Stingy SSDs, May 6, 2015, 7 pages.

* cited by examiner

*Primary Examiner* — David Lam
(74) *Attorney, Agent, or Firm* — Lowenstein Sandler LLP

(57) ABSTRACT

A transitory idle state is established for a memory sub-system that can be transitioned from an active state to one or more idle states including the transitory idle state and a deep idle state. A power consumption metric and transition time for each idle state is identified. A transitional energy metric is determined for each idle state based on the corresponding power consumption metric transition time. An energy target time is determined for the transitory idle state. Based on the energy target time, an idle state optimization time is determined for the transitory idle state. The memory sub-system is maintained in the transitory idle state for a duration of the idle state optimization time.

19 Claims, 6 Drawing Sheets

MANAGEMENT OF POWER STATE TRANSITIONS OF A MEMORY SUB-SYSTEM

TECHNICAL FIELD

The present disclosure generally relates to a memory sub-system, and more specifically, relates to power state transitions of a memory sub-system.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
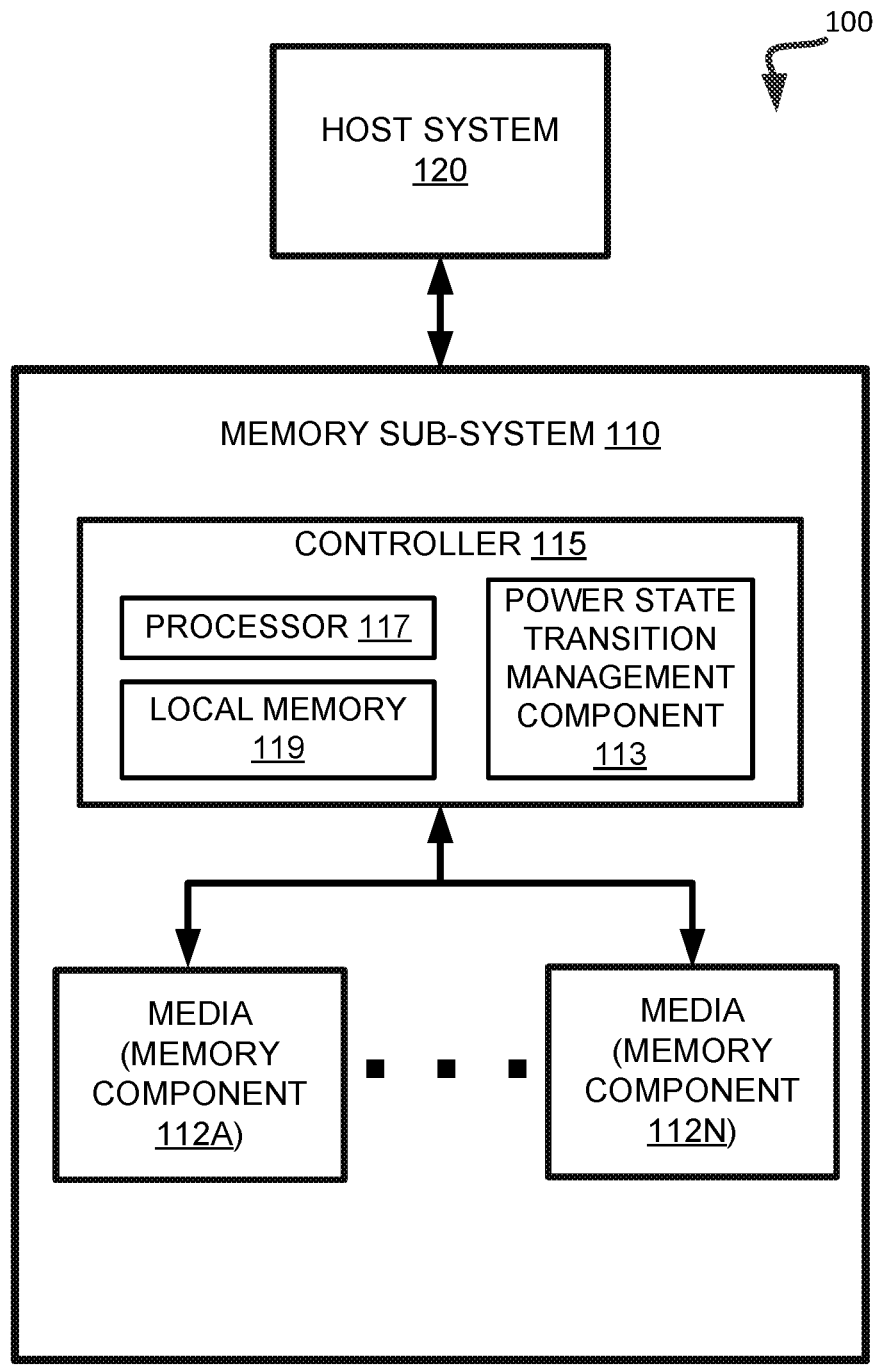
FIG. 1 illustrates an example computing environment that includes a memory sub-system in accordance with some embodiments of the present disclosure.

Aspects of the present disclosure are directed to management of power state transitions of a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

A memory sub-system can have multiple power states (PS) which are grouped as either an active power state or an idle power state. In an example, a memory sub-system can have multiple idle power states, such as a shallow idle state that can be a state where contexts are not written to non-volatile memory and which exhibit a shorter relative entry/exit latency (e.g., a time or delay associated with transitioning from one power state to another power state) than a "deeper" or lower idle state. A lowest idle state (herein referred to as a "deep idle state") in a memory sub-system is typically achieved by turning off most hardware logic, memory components and non-volatile memory. For example, when the memory sub-system enters the deep idle state, power to components of the memory sub-system can be turned off to minimize power consumption while in the deep idle state. In view of the loss of power, contexts (e.g., state information associated with the components of the memory sub-system) in the volatile memory are written to non-volatile memory, so that the state of the memory sub-system can be restored when the memory sub-system exits the deep idle state and returns to an active state.

Storing and retrieving contexts to non-volatile memory can cause a negative impact to command response time and input/output (TO) performance of the memory sub-system. Accessing non-volatile memory also consumes power, and frequent transitions to a deep idle state increases overall power consumption contributing to performance issues (e.g., shorter battery operation time when the memory component is employed on a mobile platform). In addition, frequent power state transitions to the deep idle state increases the number of write operations to non-volatile memory and produces a negative impact to an endurance of the memory sub-system.

When a conventional memory sub-system is idle without a command from a host system, the memory sub-system can transition from an active state to a low power state (also referred to as an "idle state"), such as a deep idle state. Typical memory sub-system behavior shows a significant number of these power state transitions can occur over short intervals. As a result, entering and exiting to and from an active state to a deep idle state can involve transitioning media (i.e., copying data from volatile memory to non-volatile memory) with energy and thermal consumption. For example, following the transition of a conventional memory sub-system from an active state to a deep idle state resulting in the transitioning of media, energy consumption, an increase of required thermal power, and corresponding entry/exit latencies, the host system can send a command to the memory sub-system producing a transition back to the active state. In this example, inefficiencies are produced by the transition to the deep idle state and rapid return transition to the active state.

Aspects of the present disclosure address the above and other deficiencies by utilizing a power state transition management component to establish a transitory idle state for transitioning a memory sub-system. In an embodiment, the transitory idle state is a low power stage that can be entered to enhance media life and improve a thermal consumption as a result of avoidance of management of the power state transitions of a memory sub-system. In an embodiment, when the memory sub-system is in the transitory idle state, no contexts are written to non-volatile memory and the memory sub-system experiences shorter entrance and exit latencies than the deep idle state. In an embodiment, transition from the transitory idle state to an active power state advantageously results in a lower expenditure of entry/exit transitional energy and lower entry/exit latency as compared to transitioning from the deep idle state to an active power state. In an embodiment, the transitory idle state can be defined to exhibit a power consumption level that is less than or equal to a power consumption level of a shallow idle state. In an embodiment, the transitory idle state can be defined to exhibit a power consumption level that is in a range of values between the power consumption levels of the shallow idle state and the deep low state.

In some embodiments, the power state transition management component generates and maintains a data store including identified idle state duration times. In an embodiment, the power state transition management component monitors a memory sub-system to identify multiple instances of transitions into idle states and records a corresponding duration of the identified idle states. In an embodiment, using the recorded idle state duration times, the power state transition management component can determine idle time metrics. In some embodiments, the idle time metrics can include an average idle duration time (Ta) and/or a percentile value representing the idle duration times (e.g., a $95^{th}$ percentile metric (Ts), a $90^{th}$ percentile metric, etc.) associated with the multiple idle state duration times. In an embodiment, the idle time metrics can be used to determine an idle state optimization time that represents a duration or period of time to maintain a memory sub-system in the transitory idle state. In an embodiment, the power state transition management component controls the transition of the memory sub-system from an active state to the transitory idle state and maintains the memory sub-system in the transitory idle state for the duration of the idle state optimization time, before transitioning the memory sub-system to a deep idle state. In an embodiment, the idle state optimization time represents a period or duration of time in which a memory sub-system is maintained in the transitory idle state. In an embodiment, upon the expiration of the idle state optimization time, the memory sub-system can be transitioned from the transitory idle state to the deep idle state. If during the idle state optimization time a command from the host system is received which results in a transition of the memory sub-system to an active power state, the memory sub-system is transitioned from the transitory idle state to the active power state, without having transitioned the memory sub-system to the deep idle state.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative- or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a power state transition management component 113 that can be used to control power state transitions of the memory components 112A to 112N. In some embodiments, the controller 115 includes at least a portion of the power state transition management component 113. For example, the controller 115 can include a processor 117 (processing device) configured to execute instructions stored in local memory 119 for performing the operations described herein. In some embodiments, the power state transition management component 113 is part of the host system 120, an application, or an operating system.

The power state transition management component 113 can establish and manage transitioning of the memory sub-system 110 to and from a transitory idle state. In an embodiment, the transitory idle state is defined to exhibit a shorter entry and exit latency as compared to a deep idle state. In an embodiment, the deep idle state is a lowest power state of a memory component where all or most of the hardware components are turned off, including the powering down of non-volatile memory. In an embodiment, when the memory component enters the deep idle state, power to the hardware and memory components of the memory sub-system 110 is turned off. In response to a command, a transition can be made from the deep idle state to an active power state (e.g., a state wherein the memory sub-system is fully powered and consumes a higher amount of energy as compared to when operating in an idle power state). The transition between the deep idle state and active power state results in the expenditure of a highest level of entry and exit transitional energy and entry and exit latency.

According to embodiments, the expenditure of transitional energy and latency is reduced by placing the memory sub-system in the transitory idle state for more efficient transitions to the active state in response to the processing of a command from the host system 120 which results in the transition to the active power state.

In an embodiment, the power state transition management component 113 controls the memory component to process commands from the host system 120 in the active power state and transitions to the transitory idle state when there is no activity (e.g., commands) for a period of time or in response to an instruction or command from the host system 120 (e.g., a command to enter an idle state). Advantageously, the expenditure of transitional energy and latency corresponding to the transition from the active state to the transitory idle state is less than a transition from the active state to a deep idle state, as described below in connection with FIG. 5.

In an embodiment, the power state transition management component 113 determines an optimal time or duration (also referred to as the "idle state optimization time") to remain in the transitory idle state before transitioning to a deep idle state, as described in detail below with respect to FIGS. 2 and 3. In an embodiment, by maintaining the memory component 112A-112N in the transitory idle state for the duration of the idle state optimization time, new activity or commands (e.g., commands from the host system 120) cause an exit transition from the transitory idle state to the active state. In an embodiment, the transition from the transitory idle state to the active state advantageously results in a lower expenditure of exit transitional energy and latency, as compared to energy and latency associated with a transition from the deep idle state to the active state. In an embodiment, following an expiration of the idle state optimization time, if no activity or commands are processed, the memory sub-system can be transitioned from the transitory idle state to the deep idle state. The power state transition management component 113 can establish the transitory idle state and idle state optimization time and control transitions of the memory sub-system 110 to and from the transitory idle state. Further details with regards to the operations of the power state transition management component 113 are described below.

Figure 2:
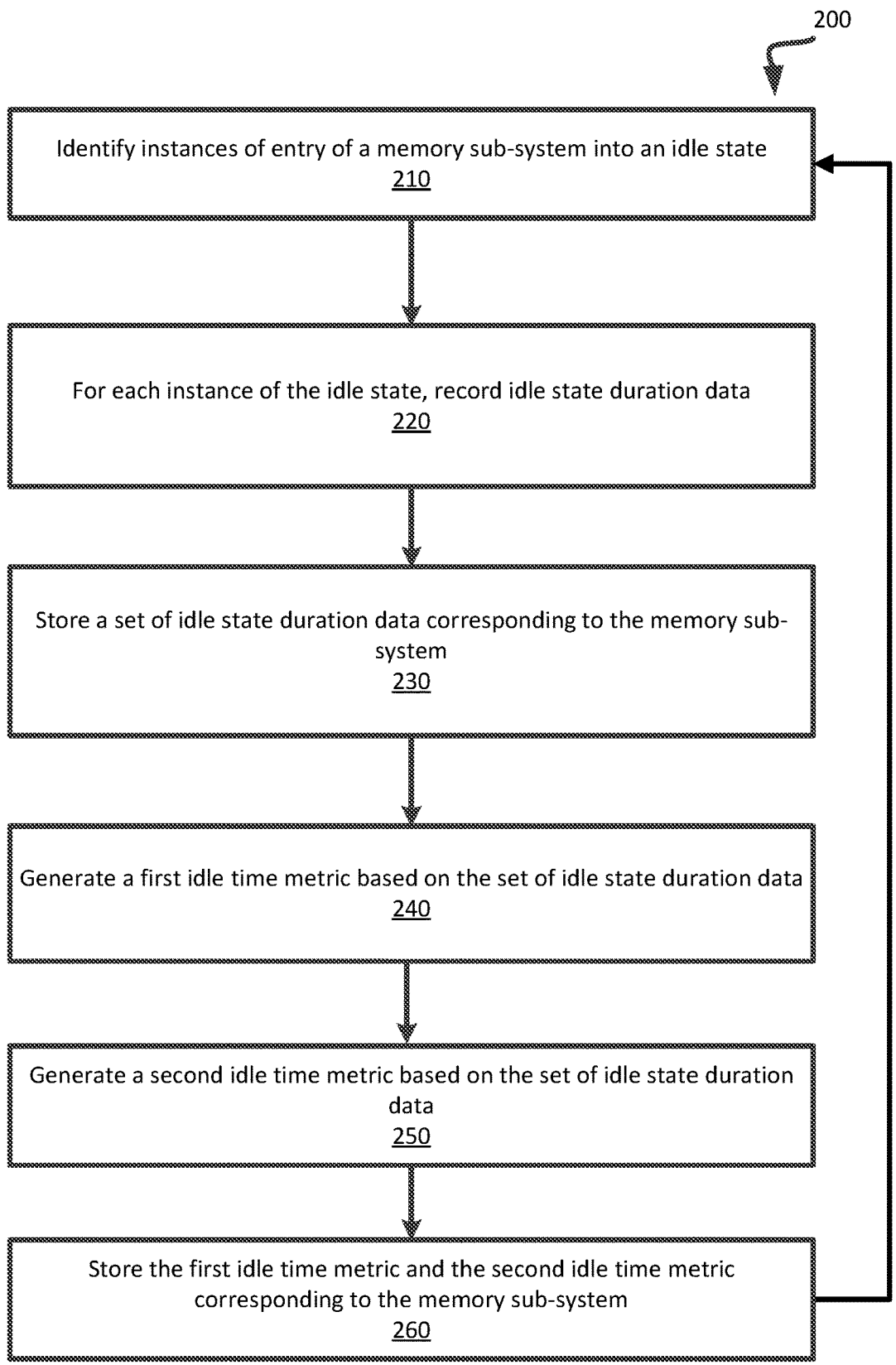
FIG. 2 is a flow diagram of an example method to generate and store idle time metrics associated with a memory sub-system in accordance with some embodiments of the present disclosure.

FIG. 2 illustrates an example method 200 to generate a data store (e.g., a database) of idle duration data and idle time metrics associated with a memory sub-system in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the power state transition management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown, at operation 210, the processing logic identifies instances of entry of a memory sub-system into an idle state (e.g., exiting an active state and entering a first idle state of multiple idle states associated with the memory sub-system). In an embodiment, if the memory sub-system is inactive for a period of time (e.g., no commands are received and processed), the memory component transitions into an idle state. In an embodiment, the operation of the memory sub-system is monitored to identify instances of entry into an idle state.

At operation 220, the processing logic records idle state duration data for each instance of entry into an idle state. In an embodiment, the idle state duration data includes information defining a length of time the memory sub-system is in an idle state before transitioning into an active state. In an embodiment, a duration of time of each instance where the memory sub-system is in an idle state is determined and recorded.

At operation 230, the processing logic stores a set of idle state duration data corresponding to the memory sub-system (e.g., the recorded idle state duration data corresponding to one or more instances of transitions to an idle state). In an embodiment, the processing logic generates and updates a data structure (e.g., an idle duration database) by recording and storing idle duration data representing durations of time spent by a memory sub-system for multiple different transition to an idle state.

At operation 240, the processing logic generates a first idle time metric based on the set of idle state duration data. In an embodiment, the first idle time metric is an average idle time (Ta) associated with the multiple idle state instances based on the idle state duration data previously recorded and stored. In an embodiment, multiple different idle duration times corresponding to multiple different idle state transitions can be averaged to generate the average idle time (Ta).

At operation 250, the processing logic generates a second idle time metric based on the set of idle state duration data. In an embodiment, the second idle time metric is a percentile idle time value associated with the multiple idle state instances based on the idle state duration data previously recorded and stored. In an embodiment, multiple different idle duration times corresponding to multiple different idle state transitions can be analyzed to generate a percentile idle time value (Ts), such as a $95^{th}$ percentile value, a $90^{th}$ percentile value, etc. In an embodiment, the second idle time metric can include a $95^{th}$ percentile value calculated by sorting the idle durations times from highest to lowest and discarding the highest 5% of the sorted values, where the next highest value is the $95^{th}$ percentile value for the analyzed set of idle duration data.

At operation 260, the processing logic stores the first idle time metric and the second idle time metric corresponding to the memory sub-system. In an embodiment, the first idle time metric and the second idle time metric are used by the processing logic to determine an idle state optimization time, as described in detail below with respect to FIG. 3. In an embodiment, as shown in FIG. 2, the generation of the first idle time metric and the second idle time metric can be performed iteratively. In an embodiment, calculations of the first idle time metric and second idle time metric can be updated periodically (e.g., according to a schedule) or in response to the occurrence of an event. For example, the first idle time metric and the second idle time metric is updated as a function of an idle count (e.g., a count of the number of times the memory sub-system enters an idle state), such as when the idle count reaches a predetermined threshold value (e.g., when the idle count reaches 1,000). In another example, the first idle time metric and the second idle time metric are updated when a predetermined percentage of the memory sub-system's lifetime is reached (e.g., upon reaching 10% of the memory sub-system lifetime). In an embodiment, the first and second idle time metrics are re-calculated based on updated or new idle duration data recorded and stored in the idle duration database, as described in operations 210-230.

Figure 3:
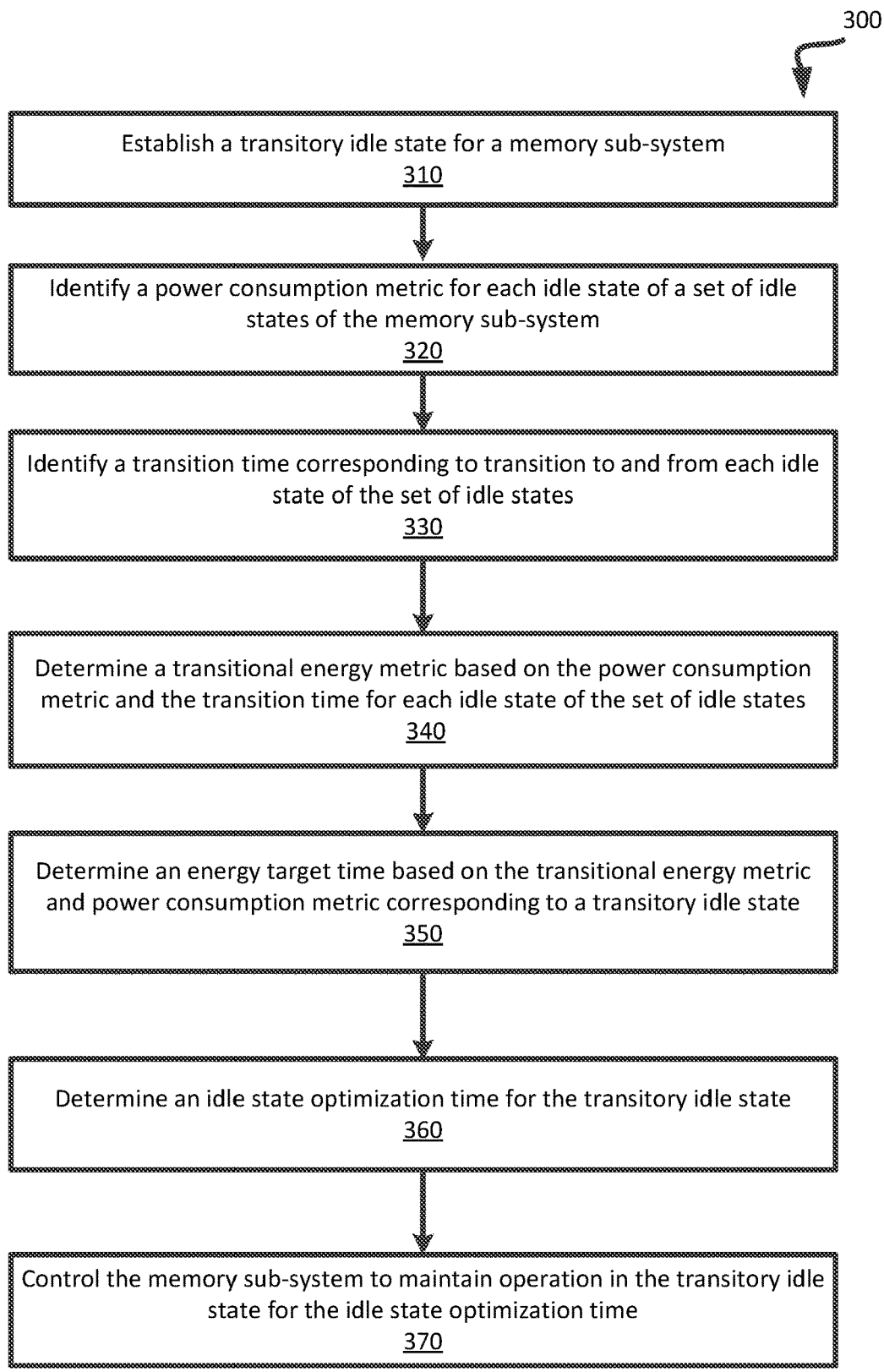
FIG. 3 is a flow diagram of an example method to establish an idle state optimization time for a memory sub-system in accordance with some embodiments of the present disclosure.

FIG. 3 illustrates an example method 300 to determine an idle state optimization time for a transitory idle state and maintain operation of a memory sub-system in the transitory idle state for a duration or length of the idle state optimization time in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the power state transition management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic establishes a transitory idle state for a memory sub-system. In an embodiment, the memory sub-system can have a set of multiple idle states including the established transitory idle state and a deep idle state (e.g., a lowest power state where context data is written to non-volatile memory and hardware components are powered down). In an embodiment, the transitory idle state can be established or defined such that no writing of data to non-volatile memory occurs when in the transitory idle state. In an embodiment, the transitory idle state can be established such that the memory sub-system while in the transitory idle state has a shorter entry and exit latency as compared to when the memory sub-system is in the deep idle state. In an embodiment, method 300 enables the determination of an idle state optimization time to be associated with the transitory idle state, as described below in greater detail.

At operation 320, the processing logic identifies a power consumption metric for each idle state of a set of multiple idle states associated with the memory sub-system. In an embodiment, the set of multiple idle states includes the transitory idle state established in operation 310. In an embodiment, the power consumption metric is a value that indicates an amount of power used or consumed when the memory component is in the corresponding idle state. In an embodiment, the processing logic determines the power consumption metric for each of the corresponding idle states (e.g., a first power consumption metric (P1) representing a power consumption metric for a first idle state, a second power consumption metric (P2) representing a second idle state, a third power consumption metric (P3) representing a power consumption metric for a third idle state, etc.) In an embodiment, the set of idle states includes, but is not limited to, a shallow idle state, the transitory idle state and the deep idle state. In an embodiment, the power consumption metrics can be stored (e.g., in tabular form or other such data structure) in association with the memory sub-system such that the processing logic can read the memory sub-system to identify the power consumption metrics. In an embodiment, the power consumption metrics can be static values that can be updated as a function of a firmware version of the memory sub-system. For example, operation 310 can be executed in connection with the updating of a firmware of the memory sub-system to identify any updates or changes to the power consumption metrics for the idle states associated with the memory sub-system.

At operation 330, the processing logic identifies a transition time (t) corresponding to transition to and from (e.g., transition in and out) each idle state of the set of idle states and one or more active states of the. For example, the processing logic can identify a first transition time (t1) associated with a first idle state, a second transition time (t2) associated with a second idle state, a third transition time (t3) associated with a third idle state, etc. In an embodiment, the transition times can be stored (e.g., in tabular form) in association with the memory sub-system such that the processing logic can read the memory sub-system to identify the transition times. The transition times can specify an amount of time that it takes for the memory sub-system to transition from one state to another state (e.g., from a first idle state to an active state, from a second idle state to an active state, etc.). In an embodiment, the transition times can be static values that can be updated as a function of a firmware version of the memory sub-system. For example, operation 320 can be executed in connection with the updating of a firmware of the memory sub-system to identify any updates or changes to the transition times for the idle states associated with the memory sub-system.

At operation 340, the processing logic determines a transitional energy metric (J) based on the power consumption metric and the transition time for each of the idle states associated with the memory sub-system. In an embodiment, a first transitional energy metric ($J_1$) is determined for a first idle state (e.g., a shallow idle state) based on a total time to transition in and out (t1) of the shallow idle state. For example, a first transitional energy ($J_1$) for a first idle state is determined in accordance with the following expression:

$$J_1 = P1 \times t1$$

In an embodiment, a second transitional energy metric ($J_2$) is determined for the transitory idle state based on a total time to transition in and out (t2) of the transitory idle state and the corresponding power consumption metric. In an embodiment, a third transitional energy metric ($J_3$) is determined for a deep idle state based on a total time to transition in and out (t3) of the deep idle state and the corresponding power consumption metric.

At operation 350, the processing logic determines an energy target time (also referred to as an "energy 'break even' time" or ("TargetTime")) for each of the idle states based on the transitional energy metrics and power consumption metrics corresponding to the idle states of the memory sub-system. In an embodiment, the TargetTime is determined based on the transitional energy metric divided by a sum or combination of power consumption metrics corresponding to adjacent idle states. In an embodiment, the TargetTime for a first idle state is calculated in accordance with the following expression:

TargetTime(t1)=$J_1$/(P1+P2), where P1 and P2 are the power consumption metrics of the first idle state and the second idle state (i.e., power levels of adjacent idle states).

At operation 360, the processing logic determines an idle state optimization time for the transitory idle state. In an embodiment, the idle state optimization time represents a length or duration of time that the memory sub-system is to remain in the transitory idle state before transitioning to a deep idle state. In an embodiment, the idle state optimization time can be determined by comparing the TargetTime to a threshold idle time metric. In an embodiment, the threshold idle time metric is based on a combination of the first idle time metric (e.g., as determined in operation 240 of FIG. 2) and the second idle time metric (e.g., as determined in operation 250 of FIG. 2).

In an embodiment, if the processing logic determines that TargetTime does not satisfy the threshold idle time metric, the processing logic sets the idle state optimization time equal to the TargetTime. In an embodiment, the TargetTime does not satisfy the threshold idle time metric when the TargetTime is less than the threshold idle time metric (e.g., less than the sum or combination of the first idle time metric (e.g., Ta) and the second idle time metric (e.g., Ts)). In an embodiment, if the processing logic determines that the TargetTime satisfies the threshold idle time metric, the processing logic sets the idle state optimization time to the sum or combination of the first idle time metric and the second idle time metric. In an embodiment, the TargetTime satisfies the threshold idle time when the TargetTime is greater than or equal to the threshold idle time (e.g., greater than or equal to the sum or combination of the first idle time metric and the second idle time metric). For example, the processing logic can determine the idle state optimization time in accordance with the following expression:

If the TargetTime<(Ta+Ts),then the idle state optimization time=TargetTime; or

If the TargetTime≥(Ta+Ts),then the idle state optimization time=(Ta+Ts).

At operation 370, the processing logic sets the idle state optimization time (per operation 360) and controls the memory component to maintain operation in the transitory idle state for the idle state optimization time. In an embodiment, in response to receiving a command from a host system to transition to the deep idle state, the processing logic can transition to the transitory idle state and maintain operation in the transitory idle state for a duration of the idle state optimization time. In an embodiment, the idle state optimization time is a period or duration that serves as a timer which determines a length of time the memory sub-system remains in the transitory idle state before transitioning to the deep idle state. For example, the idle state optimization time can be in a range of values of approximately 5 seconds to 7 seconds. In an embodiment, if during the idle state optimization time a command is received from the host system to transition to an active state, the memory sub-system transitions from the transitory idle state to the active state. In an embodiment, if no command is received during the idle state optimization time, at the expiration of the idle sate optimization time, the memory sub-system is transitioned form the transitory idle state to the deep idle state.

Figure 4:
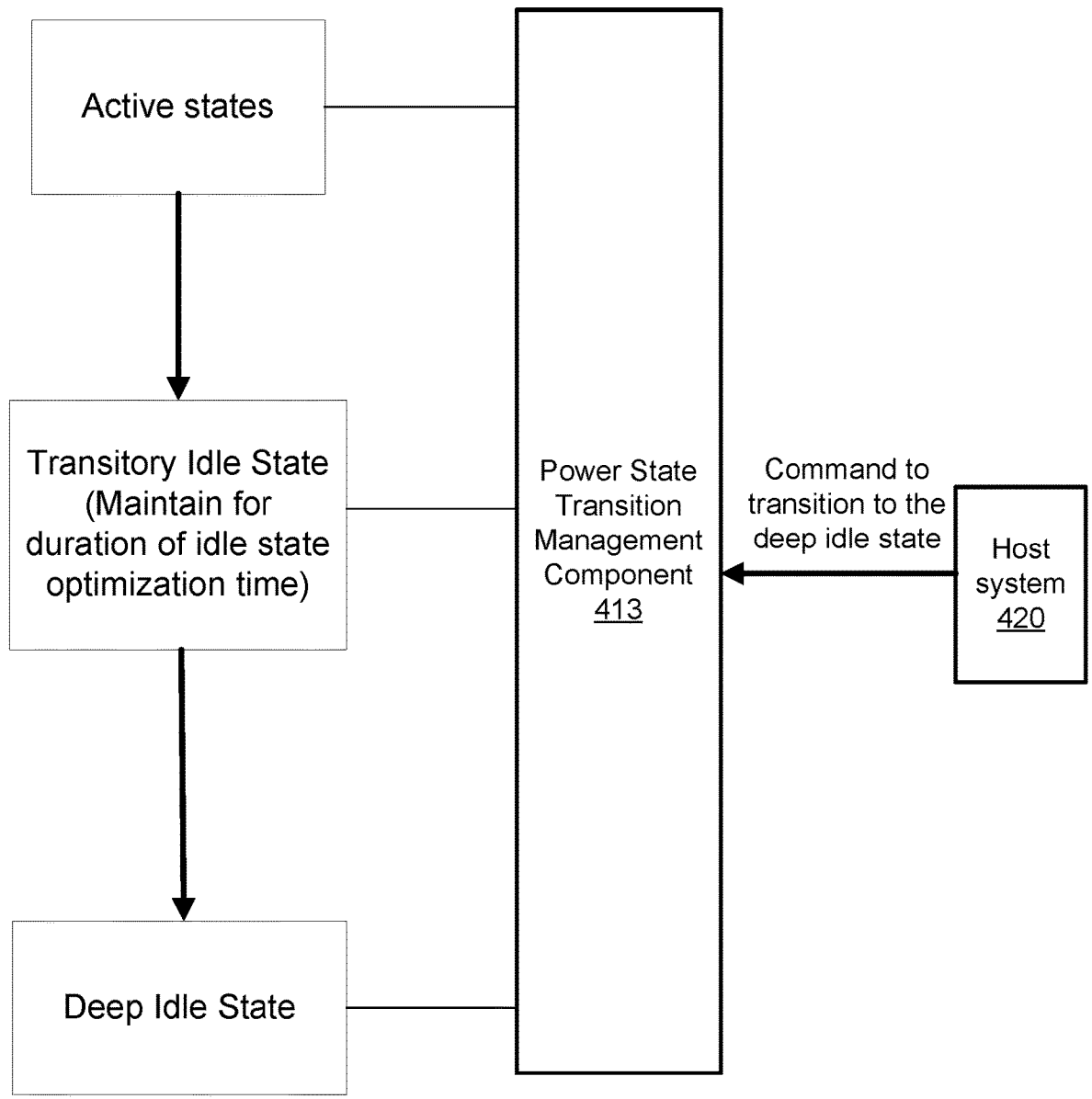
FIG. 4 illustrates an example power state transition management component controlling power states associated with a memory component in accordance with some embodiments of the present disclosure.

FIG. 4 illustrates an example of a power state transition management component 413 controlling state transitions of a memory sub-system, according to embodiments of the present disclosure. In an embodiment, the power state transition management component 413 defines and establishes the transitory idle state and a corresponding idle state optimization time (as described above in connection with FIGS. 2 and 3). In an embodiment, the transitory idle state can exhibit a power consumption level that is less than or equal to a power consumption level associated with a shallow idle state (not shown in FIG. 4). In an embodiment, a host system 420 can send a command to transition the memory component from an active state to the deep idle state. In an embodiment, in response to the command, the power state transition management component 413 can transition the memory component to the transitory idle state (instead of the deep idle state). In an embodiment, the power state transition management component 413 maintains the memory component in the transitory idle state for a duration of the idle state optimization time.

In an embodiment, if, during the idle state optimization time, a command is received from the host system 420 that calls for a transition back to the active state (e.g., a write command), the power state transition management component 413 transitions the memory sub-system from the transitory idle state to an active state (e.g., exits the transitory idle state). In an embodiment, if no command is received from the host system 420 during the idle state optimization time, the power state transition management component 413 transitions the memory sub-system from the transitory idle state to the deep idle state.

Figure 5:
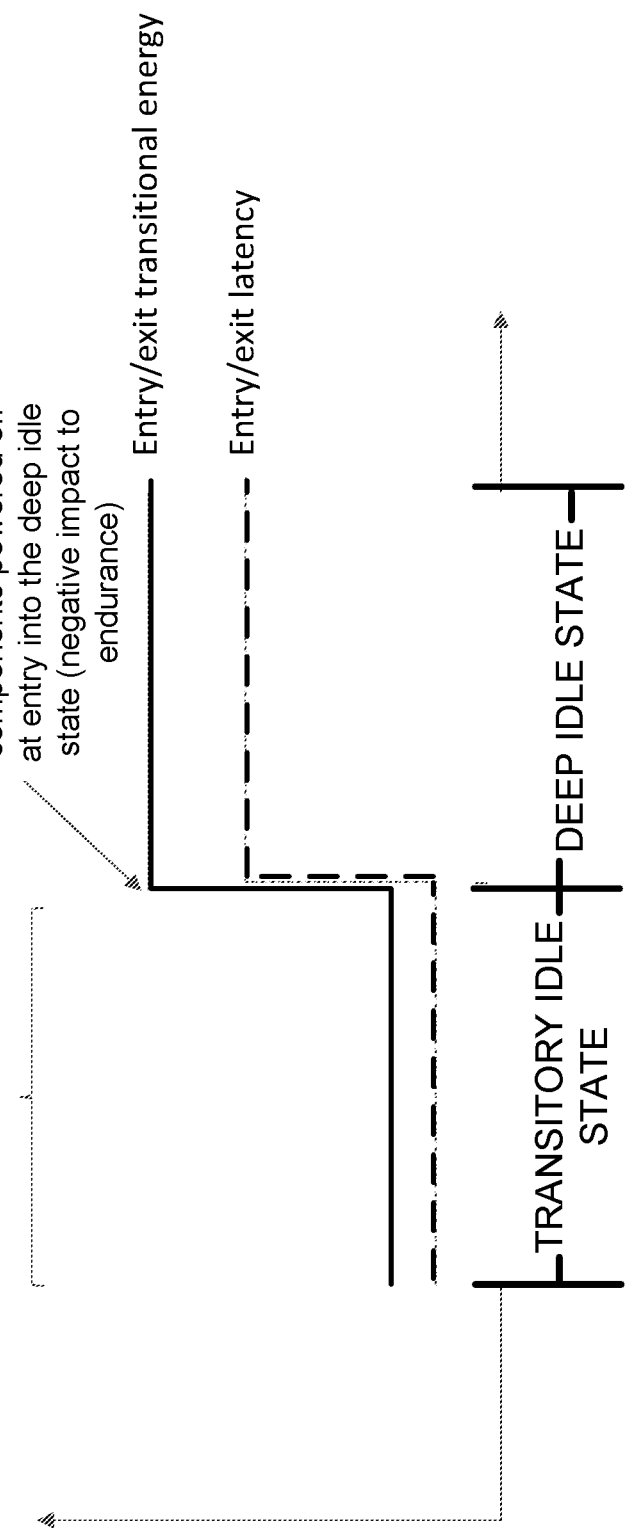
FIG. 5 is a graph illustrating example operational characteristics associated with idle states of a memory component in accordance with some embodiments of the present disclosure.

FIG. 5 illustrates an example graphical comparison of operational metrics associated with the transitory idle state and the deep idle state, according to embodiments of the present disclosure. As shown in FIG. 5, the memory sub-system operating in the transitory idle state exhibits a relatively lower entry/exit latency and entry/exit transitional energy (e.g., as represented by the dashed line in FIG. 5) as compared to the entry/exit latency and entry/exit transitional energy associated with the deep idle state (e.g., as represented by the solid line in FIG. 5). In an embodiment, it is determined based on the identification of the first idle time metric and the second idle time metric (e.g., as determined by method 200 of FIG. 2) that there is a higher probability of exiting from the transitory idle state (e.g., in response to receipt of a host system command while in the transitory idle state). In an embodiment, the power state transition management component 113 can achieve shorter transition times and less power consumption by transitioning the memory sub-system to the transitory idle state instead of transitioning the memory sub-system to the deep idle state. In an embodiment, the shorter entry and exit latencies associated with the transitory idle time produce shorter command handling latency and improvements to IO performance.

In an embodiment, maintaining the memory sub-system in the transitory idle state for the idle state optimization time reduces the number of times that the memory sub-system performs transitions to the deep idle state, thereby reducing the number of times that context data is written to non-volatile memory. In an embodiment, since non-volatile media has a limited endurance, transitioning to the transitory idle state and the avoidance of frequent entry into the deep idle state and the corresponding increased write operations (e.g., writing the context data) and powering off of the memory sub-system upon entry into the deep idle state results in a preservation of a lifespan of the non-volatile media. In an embodiment, commands received during the idle time which trigger a transition to an active state from the transitory idle state result in the avoidance of the negative effects of entering the deep idle state, including the negative impact on endurance associated with powering down upon entry into the deep idle state and the entry and exit latencies associated with entry into the deep idle state.

Figure 6:
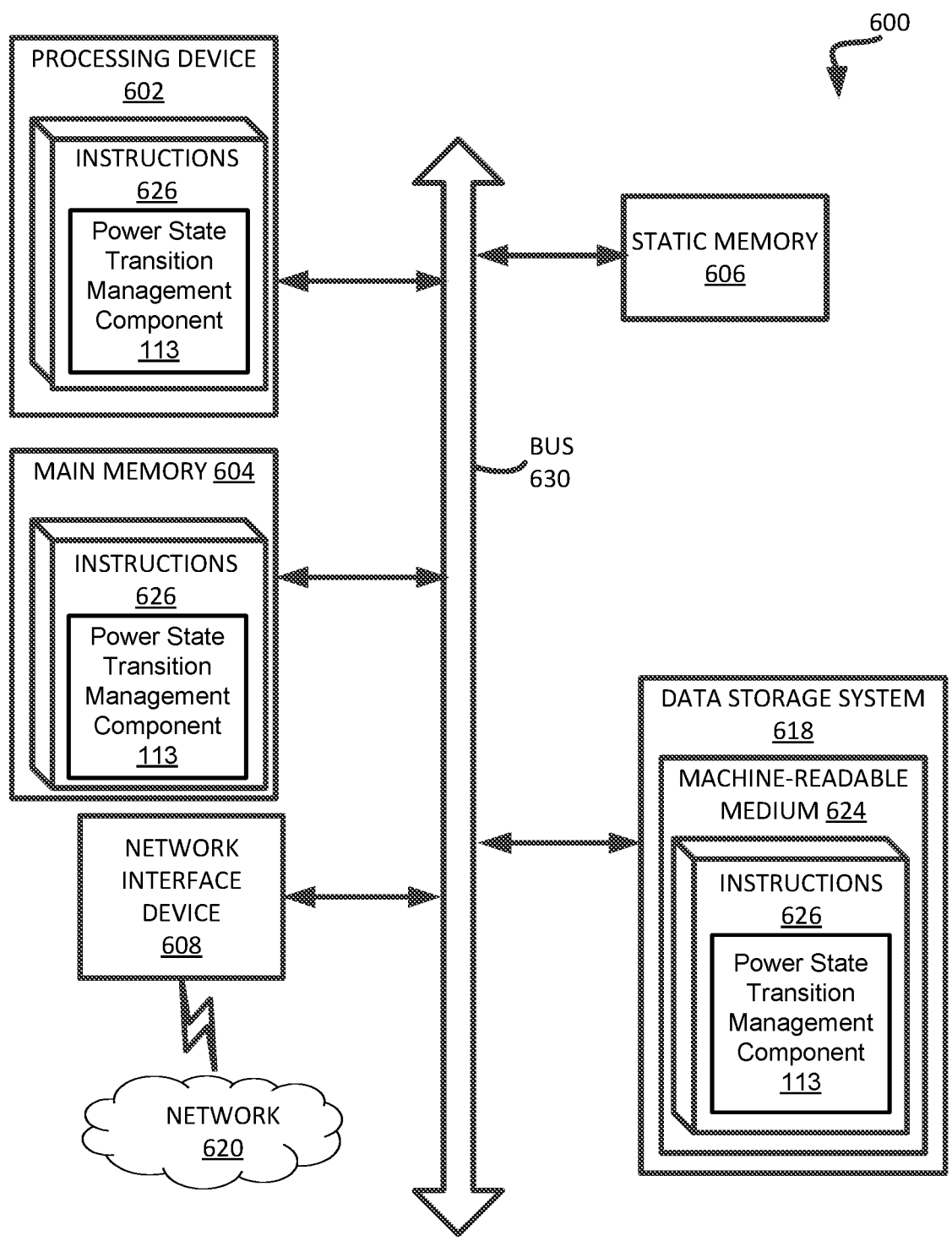
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power state transition management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a power state transition management component (e.g., the power state transition management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
establishing, by a processing device, a transitory idle state for a memory sub-system, wherein the memory sub-system comprises an active state and a set of idles states comprising the transitory idle state and a deep idle state;
identifying a power consumption metric for each idle state of the set of idle states of the memory sub-system;
identifying a transition time corresponding to transition to and from each idle state of the set of idle states;
determining a transitional energy metric based on the power consumption metric and the transition time for each idle state of the set of idle states;
determining an energy target time based on the transitional energy metric and the power consumption metric corresponding to the transitory idle state;
determining an idle state optimization time for the transitory idle state based on the energy target time; and
controlling the memory sub-system to maintain operation in the transitory idle state for a duration of the idle state optimization time.

2. The method of claim 1, further comprising:
receiving, from a host system, a command to transition the memory component from an active state to a deep idle state; and
in response to the command, transitioning the memory component from the active state to the transitory idle state.

3. The method of claim 1, further comprising:
identifying an expiration of the idle state optimization time; and
transitioning the memory sub-system from the transitory idle state to the deep idle state in response to the expiration of the idle state optimization time.

4. The method of claim 1, further comprising generating a set of idle state duration data corresponding to a plurality of instances of entry of the memory sub-system into one or more idle states of the memory sub-system.

5. The method of claim 4, further comprising:
generating a first idle time metric based on the set of idle state duration data; and
generating a second idle time metric based on the set of idle state duration data.

6. The method of claim 5, further comprising:
determining the energy target time is less than a threshold idle time metric; and
establishing the energy target time as the idle state optimization time.

7. The method of claim 5, further comprising:
determining the energy target time is greater than or equal to a threshold idle time metric; and
establishing a combination of the first idle time metric and the second idle time metric as the idle state optimization time.

8. A system comprising:
a memory component; and
a processing device, operatively coupled with the memory component, to:
establish a transitory idle state for a memory sub-system comprising an active state and a deep idle state, wherein a first transitional energy associated with the transitory idle state is less than a second transitional energy associated with the deep idle state;
determine an idle state optimization time for the transitory idle state;
receive, from a host system, a first command associated with transitioning the memory sub-system from the active state to the deep idle state;
transition the memory sub-system to the transitory idle state in response to receiving the first command; and
maintain the memory sub-system in the transitory idle state for a duration of the idle state optimization time.

9. The system of claim 8, the processing device is further to:
receive a second command from the host system during the idle state optimization time; and
transition the memory sub-system from the transitory idle state to the active state in response to receiving the second command during the idle state optimization time.

10. The system of claim 8, the processing device is further to:
identify an expiration of the duration of the idle state optimization time; and
transition the memory sub-system from the transitory idle state to the deep idle state in response to identifying the expiration of the duration of the idle state optimization time.

11. The system of claim 8, wherein a first exit latency associated with the transitory idle state is less than a second exit latency associated with the deep idle state.

12. The system of claim 8, wherein a first entry latency associated with the transitory idle state is less than a second entry latency associated with the deep idle state.

13. The system of claim 8, wherein context data is written to non-volatile memory in response to entry of the memory sub-system into the deep idle state.

14. A non-transitory computer readable medium comprising instructions, which when executed by a processing device, cause the processing device to perform operations comprising:
establishing a transitory idle state associated with a memory sub-system;
identifying a power consumption metric for each idle state of a set of idle states of the memory sub-system, wherein the set of idle states comprises a shallow idle state, the transitory idle state and a deep idle state;
identifying a transition time corresponding to transition to and from each idle state of the set of idle states;
determining a transitional energy metric based on the power consumption metric and the transition time for each idle state of the set of idle states;
determining an energy target time based on the transitional energy metric and the power consumption metric corresponding to the transitory idle state;
determining an idle state optimization time for the transitory idle state based on the energy target time; and
controlling the memory sub-system to maintain operation in the transitory idle state for a duration of the idle state optimization time.

15. The non-transitory computer readable medium of claim 14, the operations further comprise:
generating a set of idle state duration data corresponding to a plurality of instances of entry of the memory sub-system into one or more idle states of the memory sub-system;
generating a first idle time metric based on the set of idle state duration data; and
generating a second idle time metric based on the set of idle state duration data.

16. The non-transitory computer readable medium of claim 15, the operations further comprise:
determining the energy target time is less than a threshold idle time metric; and
establishing the energy target time as the idle state optimization time.

17. The non-transitory computer readable medium of claim 15,
determining the energy target time is greater than or equal to a threshold idle time metric; and
establishing a combination of the first idle time metric and the second idle time metric as the idle state optimization time.

18. The non-transitory computer readable medium of claim 14, wherein a first exit latency associated with the transitory idle state is less than a second exit latency associated with the deep idle state.

19. The non-transitory computer readable medium of claim 14, wherein a first transitional energy associated with the transitory idle state is less than a second transitional energy associated with the deep idle state.

* * * * *